US012666857B2

(12) United States Patent
Han

(10) Patent No.: US 12,666,857 B2
(45) Date of Patent: Jun. 23, 2026

(54) FOLDABLE DISPLAY MODULE AND FOLDABLE DISPLAY DEVICE

(71) Applicant: Wuhan China Star Optoelectronics Semiconductor Display Technology Co., Ltd., Wuhan (CN)

(72) Inventor: Wen Han, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 423 days.

(21) Appl. No.: 18/269,782

(22) PCT Filed: May 12, 2023

(86) PCT No.: PCT/CN2023/093854
§ 371 (c)(1),
(2) Date: Jun. 27, 2023

(87) PCT Pub. No.: WO2024/216686
PCT Pub. Date: Oct. 24, 2024

(65) Prior Publication Data
US 2025/0048914 A1    Feb. 6, 2025

(30) Foreign Application Priority Data

Apr. 17, 2023    (CN) ......................... 202310417025.0

(51) Int. Cl.
*H10K 77/10*          (2023.01)
*G06F 3/041*          (2006.01)
(Continued)

(52) U.S. Cl.
CPC ............ *H10K 77/111* (2023.02); *G06F 3/041* (2013.01); *H10K 59/131* (2023.02); *H10K 59/38* (2023.02);
(Continued)

(58) Field of Classification Search
CPC .... H10K 77/111; H10K 59/131; H10K 59/38; H10K 59/40; H10K 59/8722;
(Continued)

(56) References Cited

U.S. PATENT DOCUMENTS 10,043,421 B2    8/2018    Koo et al.
11,871,602 B2    1/2024    Park et al.
(Continued)

FOREIGN PATENT DOCUMENTS

CN      108807474      11/2018
CN      111081742      4/2020
(Continued)

OTHER PUBLICATIONS

Notice of Grounds of Reasons for Rejection Dated Dec. 16, 2024 From the Korean Intellectual Property Office Re. Application No. 10-2023-7039493 and Its Translation Into English. (14 Pages).
(Continued)

*Primary Examiner* — J. E. Schoenholtz

(57)          ABSTRACT

The present application provides a foldable display module and a foldable display device. The foldable display module includes a foldable region and a non-foldable region adjacent to the foldable region, and further includes a display main body structure and a glass substrate. The glass substrate is disposed on a back side of a light emitting surface of the display main body structure, and a thickness of a portion of the glass substrate corresponding to the foldable region is less than or equal to 100 microns.

20 Claims, 5 Drawing Sheets

(51) Int. Cl.

| | |
|---|---|
| *H10K 59/131* | (2023.01) |
| *H10K 59/38* | (2023.01) |
| *H10K 59/40* | (2023.01) |
| *H10K 59/80* | (2023.01) |
| *H10K 102/00* | (2023.01) |

(52) U.S. Cl.
CPC ......... *H10K 59/40* (2023.02); *H10K 59/8722* (2023.02); *G06F 2203/04102* (2013.01); *H10K 2102/311* (2023.02); *H10K 2102/351* (2023.02)

(58) Field of Classification Search
CPC ....... H10K 2102/311; H10K 2102/351; H10K 59/873; H10K 59/129; H10K 59/87; G06F 3/041; G06F 2203/04102; G06F 1/1652; G09F 9/301
See application file for complete search history.

(56) References Cited

U.S. PATENT DOCUMENTS

| | | | | |
|---|---|---|---|---|
| 2020/0004295 A1* | 1/2020 | Paek | .................... | G06F 1/1652 |
| 2021/0004104 A1* | 1/2021 | Hong | .................... | G02B 5/201 |
| 2021/0135146 A1* | 5/2021 | Kim | ..................... | H10K 71/00 |
| 2021/0249628 A1 | 8/2021 | He et al. | | |
| 2021/0408412 A1* | 12/2021 | Park | ..................... | B32B 23/08 |
| 2022/0006038 A1* | 1/2022 | Park | .................... | H10K 59/873 |
| 2023/0299247 A1* | 9/2023 | Lee | .................... | G02F 1/13452 |
| 2023/0309368 A1* | 9/2023 | Allan | ................... | H10K 77/111 |
| 2024/0163356 A1* | 5/2024 | Bae | ....................... | G06F 1/1681 |
| 2024/0172507 A1* | 5/2024 | Kim | ...................... | H10K 59/124 |
| 2024/0260375 A1* | 8/2024 | Seo | ....................... | H10K 59/40 |
| 2025/0098090 A1* | 3/2025 | Yoon | ..................... | H10K 71/70 |
| 2025/0176121 A1* | 5/2025 | Woo | ...................... | G06F 1/1652 |

FOREIGN PATENT DOCUMENTS

| | | |
|---|---|---|
| CN | 111276518 | 6/2020 |
| CN | 111986575 | 11/2020 |
| CN | 113889512 | 1/2022 |
| CN | 115116342 | 9/2022 |
| CN | 115295589 | 11/2022 |
| CN | 115588365 | 1/2023 |
| KR | 10-2022-0105665 | 7/2022 |
| KR | 10-2022-0122053 | 9/2022 |
| KR | 10-2471237 | 11/2022 |

OTHER PUBLICATIONS

International Search Report and the Written Opinion Dated Dec. 21, 2023 From the International Searching Authority Re. Application No. PCT/CN2023/093854 and Its Translation Into English. (18 Pages).

Request for the Submission of An Opinion Dated Aug. 11, 2025 From the Korean intellectual Property Office Re. Application No. 10-2023-7039493 and Its Translation Into English. (18 Pages).

* cited by examiner

100

200

<u>200</u>

<u>200</u>

_200_

_200_

200

200

FOLDABLE DISPLAY MODULE AND FOLDABLE DISPLAY DEVICE

CROSS-REFERENCE TO RELATED APPLICATIONS

This application is a US national phase application based upon an International Application No. PCT/CN2023/093854, filed on May 12, 2023, which claims priority to Chinese Patent Application No. 202310417025.0, filed on Apr. 17, 2023, and entitled "FOLDABLE DISPLAY MODULE AND FOLDABLE DISPLAY DEVICE". The entire disclosures of the above application are incorporated herein by reference.

TECHNICAL FIELD

The present application relates to the field of display technologies, and especially relates to a foldable display module and a foldable display device.

BACKGROUND

At present, foldable display devices have become a mainstream development direction of the display industry. From small-size foldable mobile phones to medium-size and large-size foldable notebooks, the foldable display devices are becoming more and more popular among users due to their advantages of easy storage and high portability. However, the foldable display devices are easy to generate creases during process of use, and the creases seriously affect users' experience.

Therefore, the foldable display devices are easy to generate creases during process of use, which is a pain spot in the display industry that needs to be solved urgently.

SUMMARY

Technical Issues

An object of the present application is to provide a foldable display module and a foldable display device, so as to improve a problem that the foldable display module and the foldable display device are easy to generate creases during process of use.

Technical Solutions

In a first aspect, the present application provides a foldable display module including a foldable region and a non-foldable region adjacent to the foldable region, and further including:

a display main body structure; and a glass substrate disposed on a back side of a light emitting surface of the display main body structure, a thickness of a portion of the glass substrate corresponding to the foldable region is less than or equal to 100 microns.

In a second aspect, the present application further provides a foldable display device, the foldable display device includes the foldable display module mentioned above.

Beneficial Effects

Since the glass substrate is used as a carrier plate of the display main body structure, and the thickness of the portion of the glass substrate corresponding to the foldable region is less than or equal to 100 microns, the portion of the glass substrate corresponding to the foldable region is thinned to be flexible and thus the portion of the glass substrate corresponding to the foldable region is foldable. Incorporating with that the glass substrate itself has rigidity, the display main body structure is disposed on the glass substrate, so the glass substrate and the display main body structure constitute a foldable display panel with both rigidity and flexibility. In other words, the glass substrate and the display main body structure constitute a hybrid foldable display panel. In addition, as the glass substrate provides a rigid support, it is beneficial to omit support components, such as a back plate, a foam layer, etc., on a back side of a flexible display panel in traditional arts. Therefore, the present application can omit adhesive layers on the back side of the flexible display panel, and improve the creases of the foldable display module caused by plastic deformation of the adhesive layers.

DETAILED DESCRIPTION OF THE EMBODIMENT

The technical solutions in the embodiments of the present application will be clearly and completely described below in conjunction with the drawings in the embodiments of the present application. Apparently, the embodiments described are only a part of the embodiments of the present application, rather than all the embodiments. Based on the embodiments in the present application, all other embodiments obtained by those skilled in the art without creative works should be deemed as falling within the claims of the present application.

Figure 1:
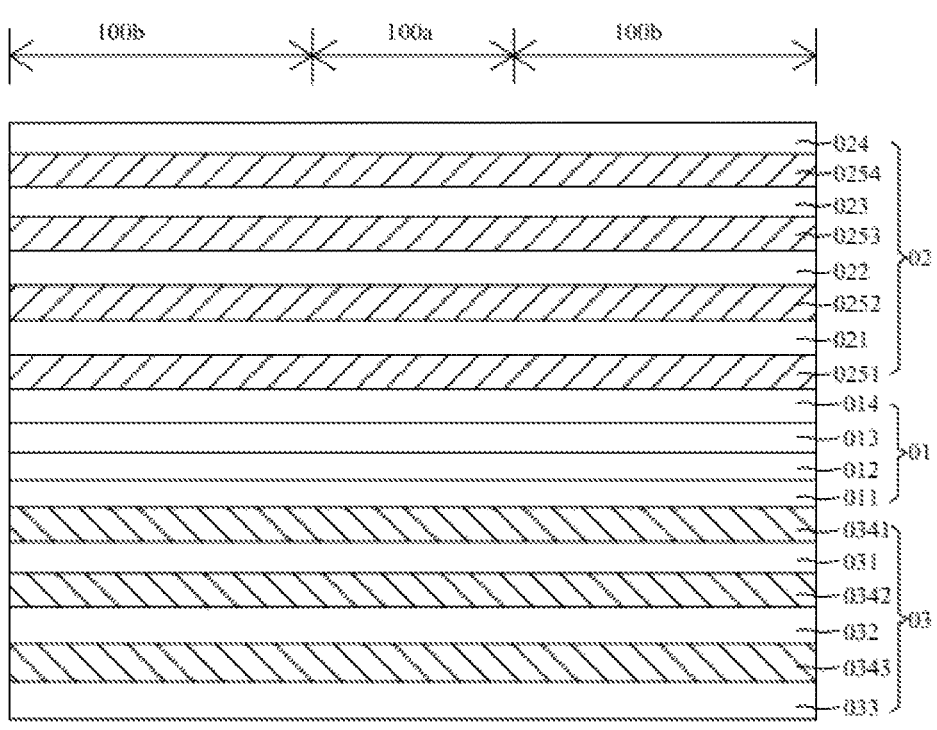
FIG. 1 is a schematic cross-sectional diagram of a foldable display module in a related art.

Please refer to FIG. 1, which is a schematic cross-sectional diagram of a foldable display module in a related art. The foldable display module 100 includes a foldable region 100*a* and two non-foldable regions 100*b*, and the two non-foldable regions 100*b* are adjacently connected to opposite sides of the foldable region 100*a*. The foldable display module 100 includes a flexible display panel 01, a first module 02 and a second module 03. The first module 02 is disposed on a light emitting side of the flexible display panel 01, and the second module 03 is disposed on a back side of the light emitting side of the flexible display panel 01.

Herein, the flexible display panel 01 includes a flexible substrate 011, a driving circuit layer 012, a light emitting device layer 013 and a thin film encapsulation layer 014 that are stacked in a sequence. The light emitting device layer 013 includes a plurality of light emitting devices, and the light emitting device is an organic light emitting diode, but is not limited thereto. The light emitting device may also be a quantum light emitting diode. The flexible substrate 011 is a polymer substrate.

The first module 02 includes a touch layer 021, a polarizer 022, an ultra-thin glass 023, a protective cover 024, a first adhesive layer 0251, a second adhesive layer 0252, a third adhesive layer 0253, and a fourth adhesive layer 0254. The first adhesive layer 0251, the second adhesive layer 0252, the third adhesive layer 0253, and the fourth adhesive layer 0254 are all optical adhesive layers (Optical Clear Adhesive, OCA) which are transparent.

The first adhesive layer 0251 adheres the touch layer 021 to the thin film encapsulation layer 014 of the flexible display panel 01. The second adhesive layer 0252 adheres the polarizer 022 to the touch layer 021. The third adhesive layer 0253 adheres the ultra-thin glass 023 to the polarizer 022. The fourth adhesive layer 0254 adheres the protective cover 024 to the ultra-thin glass 023. The protective cover 024 is a polymer substrate which is transparent.

The second module 03 includes a back plate 031, a foam layer 032, a metal support layer 033, a fifth adhesive layer 0341, a sixth adhesive layer 0342 and a seventh adhesive layer 0343. Herein, the fifth adhesive layer 0341, the sixth adhesive layer 0342, and the seventh adhesive layer 0343 are all pressure sensitive adhesive layers (Pressure Sensitive Adhesive, PSA).

The fifth adhesive layer 0341 adheres the back plate 031 to the flexible substrate 011 of the flexible display panel 01. The sixth adhesive layer 0342 adheres the foam layer 032 to the back plate 031. The seventh adhesive layer 0343 adheres the metal support layer 033 to the foam layer 032.

For the foldable display module 100 in the related art, the foldable display module 100 is easy to generate creases after being folded for many times, which affects appearance of the foldable display module 100.

The inventor disassembled the foldable display module 100 in the related art, and found that, through analysis, existence of film layers that are easy to generate plastic deformation in the foldable display module 100 is a key factor that causes the creases easily. In particular, both the optical adhesive layers and the pressure sensitive adhesive layers in the foldable display module 100 are easy to generate plastic deformation.

Based on the finding mentioned above, and on the basis of related technologies, the present application reduces a number of adhesive layers in the foldable display module, or even completely remove the adhesive layers in the foldable display module so as to improve creases caused by the plastic deformation of the adhesive layers of the foldable display module.

A specific solution of the present application includes the manner that a glass substrate is used as a carrier plate of a display main body structure, and a thickness of the portion of the glass substrate corresponding to the foldable region is less than or equal to 100 microns, so that the portion of the glass substrate corresponding to the foldable region is thinned to be flexible and thus the portion of the glass substrate corresponding to the foldable region is foldable. Incorporating with that the glass substrate itself has rigidity, the display main body structure is disposed on the glass substrate, so the glass substrate and the display main body structure constitute a foldable display panel with both rigidity and flexibility. In other words, the glass substrate and the display main body structure constitute a hybrid foldable display panel. In addition, as the glass substrate provides a rigid support, it is beneficial to omit support components, such as a back plate, a foam layer, etc., on a back side of a flexible display panel in traditional technologies. Therefore, the present application can omit adhesive layers on the back side of the flexible display panel, and improve the creases of the foldable display module caused by plastic deformation of the adhesive layers.

Solutions of the present application are described below in conjunction with specific embodiments.

Figure 2:
FIG. 2 is a first type of a schematic cross-sectional diagram of a foldable display module according to an embodiment of the present application.
Figure 2:
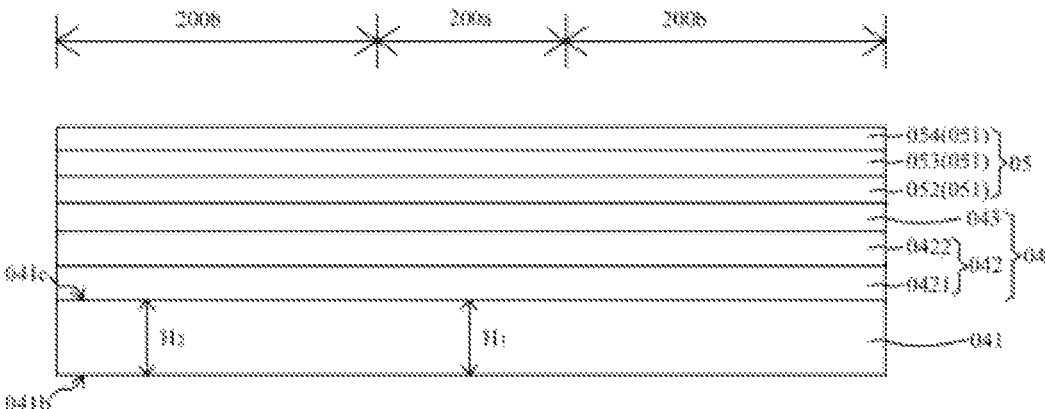

Please refer to FIG. 2, which is first type of a schematic cross-sectional diagram of a foldable display module according to an embodiment of the present application.

In this embodiment, the foldable display module 200 includes a foldable region 200a and a non-foldable region 200b adjacently connected to the foldable region 200a. The two non-foldable regions 200b are adjacently connected to opposite sides of the foldable area 200a. Under a condition that the foldable region 200a is coplanar with the non-foldable regions 200b, the foldable display module 200 is in a flattening state. Under a condition that the foldable region 200a and the non-foldable region 200b are respectively disposed in planes intersecting with each other, the foldable display module 200 is in a folding state.

The number of the foldable region 200a may be one or more. Specifically, the number of the foldable region 200a is one, and the number of the non-foldable region 200b is two.

In this embodiment, the foldable display module 200 includes a glass substrate 041 and a display main body structure 04 that are stacked in a sequence, and the glass substrate 041 is disposed on a back side of a light emitting surface of the display main body structure 04.

In this embodiment, a thickness H1 of a portion of the glass substrate 041 corresponding to the foldable region 200a is less than or equal to 100 microns. Thus, the thickness H1 of the portion of the glass substrate 041 corresponding to the foldable region 200a is thinned so that the portion of the glass substrate 041 corresponding to the foldable region 200a is flexible, and the portion of the glass substrate 041 corresponding to the foldable region 200a is foldable.

It should be noted that the glass substrate is generally used as a rigid substrate of a rigid display panel in a related art, and a thickness of the glass substrate generally ranges from 480 microns to 600 microns. Due to the thickness of the glass substrate is too thick, the rigid display panel cannot be folded. As the glass substrate is used as the rigid substrate, and the thickness of glass substrate is too thick to be folded, so the glass substrate is not currently applied to the foldable display panel.

However, the present application innovatively puts forward it that, an initial glass substrate with a thickness ranging from 480 microns to 600 microns is used as a substrate, after forming the display main body structure 04 on the initial glass substrate, and the initial glass substrate is thinned to make it that a thickness of a portion of the initial glass substrate corresponding to the foldable region is thinned to be less than or equal to 100 microns, so as to ensure that a portion of the glass substrate corresponding to the foldable region is foldable. Incorporating with that the glass substrate itself has rigidity, thereby being advantageous for the foldable display panel including the glass substrates after being thinned to be flexible and rigid.

In addition, the ultra-thin glass 023 in the related art is too thin to be directly used as a carrier plate for the display main body structure 04. Furthermore, when the ultra-thin glass 023 is used as a rigid carrier plate, the ultra-thin glass 023 is attached to the back side of the light emitting surface of the display main body structure 04 by means of an adhesive layer, but the adhesive layer increases a risk of forming creases in a folding process of the foldable display module 200.

In this embodiment, as the display main body structure 04 is formed directly on the initial glass substrate, there is no adhesive layer disposed between the display main body structure 04 and the glass substrate 041.

In this embodiment, the thickness H1 of the portion of the glass substrate 041 corresponding to the foldable region 200a is greater than 0 microns, so that the portion of the glass substrate 041 corresponding to the foldable region 200a is foldable, and the portion of the glass substrate 041 corresponding to the foldable region 200a can provide a rigid support and play a protective role. The glass substrate 041 and the display main body structure 04 constitute a foldable display panel which is hybrid. Further, the portion of the glass substrate 041 corresponding to the foldable region 200a includes a rigid material, and the portion of the glass substrate 041 corresponding to the foldable region 200a can not generate plastic deformation.

Further, the thickness H1 of the portion of the glass substrate 041 corresponding to the foldable region 200a is greater than or equal to 10 microns, so as to ensure that the portion of the glass substrate 041 corresponding to the foldable region 200a can provide a rigid support, and a thinning process accuracy of the glass substrate is satisfied.

It should be noted that, the thinner the thickness H1 of the portion of the glass substrate 041 corresponding to the foldable region 200a, the better the foldability of the portion of the glass substrate 041 corresponding to the foldable region 200a, and the more difficult the thinning process is.

Understandably, the thickness H1 of the portion of the glass substrate 041 corresponding to the foldable region 200a may also be greater than or equal to 20 microns and less than or equal to 90 microns. Or, the thickness H1 of the portion of the glass substrate 041 corresponding to the foldable region 200a may be greater than or equal to 30 microns and less than or equal to 80 microns. Or, the thickness H1 of the portion of the glass substrate 041 corresponding to the foldable region 200a may be greater than or equal to 40 microns and less than or equal to 60 microns. Or, the thickness H1 of the portion of the glass substrate 041 corresponding to the foldable region 200a may be greater than or equal to 12 microns and less than or equal to 18 microns.

For example, the thickness H1 of the portion of the glass substrate 041 corresponding to the foldable region 200a may be 10 microns, 15 microns, 18 microns, 20 microns, 30 microns, 35 microns, 40 microns, 45 microns, 50 microns, 55 microns, 60 microns, 65 microns, 75 microns, 80 microns, 85 microns, 90 microns, 95 microns, or 100 microns.

In this embodiment, the thickness H1 of the portion of the glass substrate 041 corresponding to the foldable region 200a is equal to a thickness H2 of a portion of the glass substrate 041 corresponding to the non-foldable region 200b, so as to ensure that the portion of the glass substrate 041 corresponding to the foldable region 200a is foldable, and to ensure a flatness of the glass substrate 041, thereby ensuring a flatness of the foldable display module 200.

Specifically, the thickness H2 of the portion of the glass substrate 041 corresponding to the non-foldable region 200b is greater than or equal to 10 microns and less than or equal to 100 microns.

For example, the thickness H2 of the portion of the glass substrate 041 corresponding to the non-foldable region 200b is 10 microns, 15 microns, 18 microns, 20 microns, 30 microns, 35 microns, 40 microns, 45 microns, 50 microns, 55 microns, 60 microns, 65 microns, 75 microns, 80 microns, 85 microns, 90 microns, 95 microns, or 100 microns.

It should be noted that, in the present application, an initial glass substrate with a thickness ranging from 480 microns to 520 microns is used as a substrate. After forming the display main body structure 04 on the initial glass substrate, a surface of the initial glass substrate away from the display main body structure 04 is thinned as a whole, and a glass substrate 041 having a thickness ranging from 10 microns to 100 microns is obtained. The thickness H1 of the portion of the glass substrate 041 corresponding to the foldable region 200a is equal to a thickness H2 of a portion of the glass substrate 041 corresponding to the non-foldable region 200b. Herein, methods for thinning glass substrates include, but are not limited to, a mechanical grinding, a chemical etching and etc.

In this embodiment, since a surface 041b of the glass substrate 041 away from the display main body structure 04 is obtained by thinning treatment, the surface 041b of the glass substrate 041 away from the display main body structure 04 is rough. However, a surface 041c of the glass substrate 041 adjacent to the display main body structure 04 is not treated, and the surface 041c of the glass substrate 041 adjacent to the display main body structure 04 is relatively smooth. Therefore, in a thickness direction of the glass substrate 041, a roughness of the surface 041b of the glass substrate 041 away from the display main body structure 04 is greater than a roughness of the surface 041c of the glass substrate 041 adjacent to the display main body structure 04.

In this embodiment, the display main body structure 04 includes a display pixel layer 042 and a thin film encapsulation layer 043.

In this embodiment, the display pixel layer 042 is disposed on a side of the glass substrate 041. Specifically, the display pixel layer 042 is disposed on a surface of the glass substrate 041, in other words, the display pixel layer 042 is in direct contact with the surface of the glass substrate 041.

In this embodiment, since the display pixel layer 042 is in direct contact with the surface of the glass substrate 041, there is no flexible substrate between the glass substrate 041 and the display pixel layer 042, so as to improve creases of the foldable display module 200 caused by plastic deformation of the flexible substrate. Herein, a material of the flexible substrate includes but is not limited to polyimide. In addition, the glass substrate 041 can play a supporting role, and the flexible substrate may be omitted.

It should be noted that, in the present application, a direct contact between two film layers means that there is no other film layer between the two film layers, for example, there is no adhesive layer between the two film layers.

The display pixel layer 042 includes a driving circuit layer 0421 and a light emitting device layer 0422 disposed on a surface of the driving circuit layer 0421 away from the glass substrate 041. The driving circuit layer 0421 includes a plurality of driving circuits. The light emitting device layer 0422 includes a plurality of light emitting devices electrically connected to the driving circuits. Herein, the light emitting device is an organic light emitting diode, but not limited thereto, and the light emitting device may also be a quantum dot light emitting diode etc.

In this embodiment, a thin film encapsulation layer 043 is used to encapsulate the display pixel layer 042, so as to prolong service life of the display main body structure 04. The film encapsulation layer 043 is disposed on a side of the display pixel layer 042 away from the glass substrate 041 and covers the display pixel layer 042.

The thin film encapsulation layer 043 includes two inorganic layers and an organic layer disposed between the two inorganic layers. A material of the inorganic layer includes, but is not limited to, at least one of silicon nitride, silicon oxide, and aluminum oxide. A material of the organic layer includes, but is not limited to, at least one of polyimide and polyacrylate.

In this embodiment, since the glass substrate 041 can play a rigid supporting role in both the foldable region 200a and the non-foldable regions 200b, the foldable display module 200 of this embodiment does not include supporting bodies, which play supporting roles in the related art, such as a back plate, a foam layer, a metal layer, etc. Thus, the present application can reduce the number of adhesive layers disposed on a back side of the light emitting surface of the display main body structure 04, and even completely remove the adhesive layers disposed on the back side of the light emitting surface of the display main body structure 04, thereby improving creases caused by plastic deformation of the adhesive layers in the foldable display module 200.

In this embodiment, the foldable display module 200 further includes a function module 05 that is disposed on a surface of the display main body structure 04 away from the glass substrate 041 and includes at least two functional layers 051 which are stacked. Any adjacent two function layers are in contact with each other.

Specifically, the function module 05 is disposed on a surface of the thin film encapsulation layer 043 away from the display pixel layer 042. The function module 05 includes at least two function layers 051, and any adjacent two function layers are in direct contact with each other.

In this embodiment, the function module 05 is disposed on the surface of the thin film encapsulation layer 043 away from the display pixel layer 042, so that the function module 05 is in direct contact with the thin film encapsulation layer 043, and an adhesive layer between the function module 05 and the thin film encapsulation layer 043 is removed, thereby improving creases of the foldable display module 200 caused by plastic deformation of the adhesive layer. Furthermore, any two layers of the function module 05 are in direct contact with each other, so that an adhesive layer between any two film layers of the function module 05 is also removed, and adhesive layers in the function module 05 are reduced, thereby further improving creases of the foldable display module 200 caused by plastic deformation of the adhesive layer.

It should be noted that, in the related art, there are four adhesive layers on the light emitting side of the flexible display panel 01. However, in the present application, the function module 05 is disposed on the surface of the thin film encapsulation layer 043 away from the display pixel layer 042, the function module 05 includes the at least two function layers 051, and any adjacent two function layers are in direct contact with each other. Thus, the four adhesive layers on the light emitting side of the flexible display panel 01 in the related art are removed.

The function layer 051 includes, but is not limited to, at least one of a touch layer, an optical function layer, and a light transmitting protective layer. Herein, the optical function layer includes, but is not limited to, a color filter layer and an optical lens layer. The light transmitting protective layer includes a hard coating layer, etc.

In this embodiment, the function module 05 includes a touch layer 052, a color filter layer 053 and a hard coating layer 054. The touch layer 052 is disposed on the surface of the display main body structure 04 away from the glass substrate 041. The color filter layer 053 is disposed on a surface of the touch layer 052 away from the display main body structure 04. The hard coating layer 054 is disposed on a surface of the color filter layer 053 away from the touch layer 052.

Specifically, the touch layer 052 is disposed on the surface of the thin film encapsulation layer 043 away from the display pixel layer 042. The color filter layer 053 is disposed on a surface of the touch layer 052 away from the thin film encapsulation layer 043. The hard coating layer 054 is disposed on a surface of the color filter layer 053 away from the touch layer 052.

In this embodiment, the touch layer 052 includes touch electrodes and touch electrode lines connected to the touch electrodes. The touch electrodes include one of a mutual capacitive touch electrode and a self-capacitive touch electrode. The touch layer 052 is directly prepared on the thin film encapsulation layer 043, so the touch layer 052 is directly attached to the display main body structure 04.

The color filter layer 053 includes a black matrix layer and a plurality of photoresist units. the black matrix layer is provided with a plurality of openings, and the plurality of photoresist units are arranged one-to-one in the plurality of openings. The color filter layer 053 is directly formed on the touch layer 052, and thus the color filter layer 053 is directly attached to the touch layer 052.

It should be noted that, in this embodiment, the color filter layer 053 replaces a polarizer in a conventional technology. The color filter layer 053 can be directly formed on the touch layer 052 without an adhesive layer, thereby being beneficial to reduce the adhesive layer.

The hard coating 054 protects function layers under the hard coating 054. A material of the hard coating 054 includes an optical adhesive layer after curing, so as to ensure that the hard coating 054 can be directly formed on the surface of the color filter layer 053 away from the touch layer 052 by coating and curing processes. Herein, a material of the optical adhesive layer after curing includes, but is not limited to, at least one of acrylic resin, epoxy resin and polyurethane.

It can be understood that the hard coating layer 054 may also include an inorganic layer. The material of the inorganic layer includes, but is not limited to, at least one of silicon nitride, silicon oxide and aluminum oxide.

It should be noted that, in the present application, the hard coating 054 replaces an ultra-thin glass and a protective cover which are traditional. Thus, the hard coating 054 can protect the function layers under the hard coating 054. Moreover, the ultra-thin glass, the protective cover, etc. are attached with adhesive layers. Since the hard coating 054 can be formed on other film layers by methods of coating, etc. without an adhesive layer, it is beneficial to reduce the number of adhesive layers in the function module 05. In addition, in some related arts, a hard coating is formed on a flexible substrate to be used as a protective cover, and thus the flexible substrate is prone to generate creases during the folding process. In the present application, the hard coating 054 is directly formed on the color filter layer 053, and thus the flexible substrate can be omitted, which is more beneficial to improve creases of the foldable display module 200 during the folding process.

It should also be noted that, as being discovered by the inventors of the present application since the glass substrate is used as a rigid supporting substrate for display main body structure 04, the glass substrate is rigid and does not easily undergo internal deformation under an action of an external force. A stress generated during a curing process has less influence on film layers under the hard coating 054 when the material of the hard coating 054 includes the optical adhesive layer after curing. The hard coating 054 is obtained by curing. However, in some related arts that only a polyimide layer is used as a substrate, since the polyimide layer is more easily deformed under an action of an external force, resulting in that a stress generated during a curing process affects performances of some film layers under the hard coating 054 when the hard coating 054 including the optical adhesive layer after curing is formed on the polyimide layer.

In other embodiments, the function module 05 may also include only one or two of the touch layer 052, the color filter layer 053 and the hard coating 054. At least one of the touch layer 052 and the color filter layer 053 may also be integrated into the display main body structure 04.

In this embodiment, since there is no adhesive layer on a light emitting side and a back side of the light emitting side of the display main body structure 04, there is no optical adhesive layers and pressure sensitive adhesive layers in the foldable display module. Thus, the present application can improve problems of poor air bubbles, concave-convex points, lamination marks, etc. caused by bonding of adhesive layers of the foldable display module 200, and realize that the foldable display module 200 has a light crease or even no crease during the folding process. Thus, an appearance of the foldable display module 200 is improved, thereby improving users' experience.

It can be understood that, in other embodiments, it may also be possible only that there is no optical adhesive layers on the light emitting side of display main body structure 04, or that there is no pressure sensitive adhesive layers on the back side of the light emitting side of the display main body structure 04, so as to improve problems of poor air bubbles, concave-convex points, lamination marks, etc., which is caused by bonding of adhesive layers of the foldable display module 200.

Figure 3:
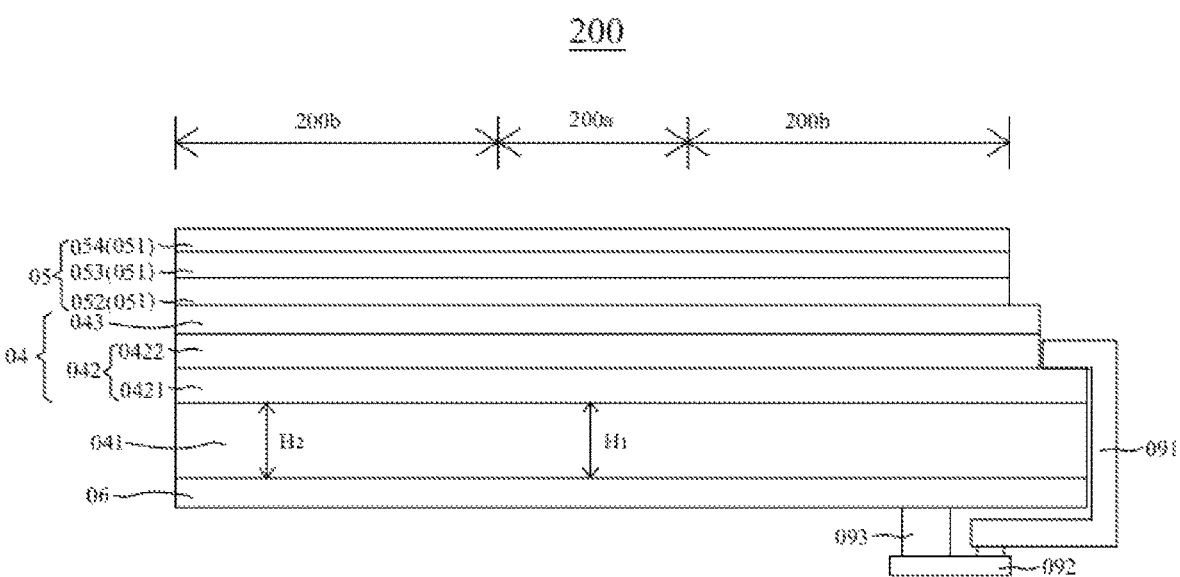
FIG. 3 is a second type of the schematic cross-sectional diagram of the foldable display module according to the embodiment of the present application.

Please refer to FIG. 3, which is a second type of the schematic cross-sectional diagram of the foldable display module according to the embodiment of the present application. The foldable display module 200 shown in FIG. 3 is basically similar to the foldable display module 200 shown in FIG. 2, and similarities therebetween are not repeated while differences therebetween include that the foldable display module 200 shown in FIG. 3 further includes an elastic buffer layer 06. The elastic buffer layer 06 is disposed on a side of the glass substrate 041 away from the display pixel layer 042, and is in direct contact with a surface of the glass substrate 041 away from the display pixel layer 042. Thus, there is no adhesive layer between the elastic buffer layer 06 and the glass substrate 041. Elastic performance of the elastic buffer layer 06 protects the glass substrate 041, and a problem that the foldable display module 200 is prone to generate creases caused by adhesive layers is improved.

In this embodiment, the elastic buffer layer 06 is disposed in the foldable region 200*a* and the non-foldable regions 200*b*.

In this embodiment, the elastic buffer layer 06 overlaps with a display region of the foldable display module 200, so as to protect the display region of the foldable display module 200.

It can be understood that the elastic buffer layer 06 may also overlap with a non-display region of the foldable display module 200. Herein, a material of the elastic buffer layer 06 includes at least one of an adhesive material and an elastic resin. A material of the adhesive material includes but is not limited to at least one of a liquid optical clear resin (Optical Clear Resin, OCR) and a solid optical clear resin. The liquid optical clear resin includes but is not limited to epoxy resins, acrylic resins, and polyurethanes, etc. The solid optical clear resin includes, but is not limited to polysiloxane, epoxy, polyurethane, etc. The elastic resin includes but is not limited to silicone and thermoplastic polyurethane.

In this embodiment, specifically, the material of the elastic buffer layer 06 includes the elastic resin, so as to ensure that the elastic buffer layer 06 has good buffer performance. Moreover, the elastic buffer layer 06 is made of the elastic resin, so that the elastic buffer layer 06 has good resilience. The elastic buffer layer 06 is more difficult to generate plastic deformation compared with optical adhesive layers and pressure sensitive adhesive layers, which is also beneficial to improve creases of the foldable display module 200 caused by plastic deformation of the adhesive layer.

In other embodiments, the material of the elastic buffer layer 06 may also include the adhesive material, so that the elastic buffer layer 06 has buffer performance. The elastic buffer layer 06 also has adhesion performance. Adhesive performance ensures a better adhesion force between the elastic buffer layer 06 and the glass substrate 041. During the folding process of the foldable display module 200, peeling between the elastic buffer layer 06 and the glass substrate 041 is not easy to occur, thereby prolonging service life of the foldable display module 200. In addition, the elastic buffer layer 06 has adhesion performance, which can also reduce a risk of direct breakage of the glass substrate 041.

A thickness of the elastic buffer layer 06 is greater than or equal to 100 microns and less than or equal to 400 microns. For example, the thickness of the elastic buffer layer 06 may be 100 microns, 120 microns, 140 microns, 160 microns, 180 microns, 200 microns, 220 microns, 240 microns, 260 microns, 280 microns, 300 microns, 320 microns, 360 microns, 380 microns, or 400 microns.

It should be noted that, the present application is unlike a buffer layer in the foldable display module in the related art which is a foam layer. The foam layer needs to be laminated with a pressure sensitive adhesive layer, so as to be fixed on a back side of the flexible display panel. As a result, the pressure sensitive adhesive layer is introduced into the foldable display module in the related art, and the pressure sensitive adhesive layer increases a risk of creases in the foldable display module. In addition, unlike the related art, there are a plurality of support layers such as a back plate, a foam layer, a metal support layer etc. on a back side of a flexible substrate carrying the display main body structure 04.

In this embodiment, a material of the elastic buffer layer 06 includes at least one of the adhesive material and the elastic resin. Both the adhesive material and the elastic resin can be film-formed by a process such as coating etc. without using an adhesive layer, thereby reducing a number of adhesive layers in the foldable display module 200. Further, in the foldable display module 200 of the present application, there is only the elastic buffer layer 06 under the glass substrate 041.

In this embodiment, when the material of the elastic buffer layer 06 includes the elastic resin, there is no adhesive layers on both of the light emitting side and the back side of the display main body structure 04. When the material of the elastic buffer layer 06 includes the adhesive material, there is no adhesive layers on the light emitting side of the display main body structure 04 and one adhesive layer is on the back side of the display main body structure 04.

In other embodiments, in the foldable display module 200, the number of adhesive layers on the light emitting side of the display main body structure 04 is less than the number of adhesive layers on the back side of the light emitting side of the display body structure 04. Thus, the number of adhesive layers on a light emitting side of the foldable display module 200 can be reduced, and creases of the foldable display module 200 caused by plastic deformation of the adhesive layers on the light emitting side can be improved.

In this embodiment, the foldable display module 200 further includes a chip-on film 091, a flexible circuit board 092 and an adhesive layer 093.

In this embodiment, one end of a chip-on-film 091 is bound to the non-display region of the display main body structure 04, so that the one end of the chip-on-film 091 is connected to the display main body structure 04. The chip-on-film 091 is bent so that another end of the chip-on-film 091 is disposed on a side of the glass substrate 041 away from the display main body structure 04. The chip-on-film 091 includes a flexible substrate and a driver chip disposed on the flexible substrate.

In this embodiment, one end of the flexible circuit board 092 is connected to the another end of the chip-on-film 091, and another end of the flexible circuit board 092 is bonded to the elastic buffer layer 06 with the adhesive layer 093, so that the another end of the flexible circuit board 092 is fixed on the elastic buffer layer 06. The flexible circuit board 092 includes a flexible substrate and a control chip disposed on the flexible substrate.

It should be noted that, unlike the related art in which a back side of the light emitting side of the foldable display module has film layers such as a metal layer, a buffer layer etc., so that a flexible circuit board needs to be fixed on the metal layer or the buffer layer, the present application makes the flexible circuit board to be fixed on the elastic buffer layer 06.

In this embodiment, the adhesive layer 093 is a reinforcing double-sided adhesive tape. The adhesive layer 093 includes a flexible substrate, a first adhesive layer, and a second adhesive layer. The flexible substrate is disposed between the first adhesive layer and the second adhesive layer. The flexible substrate provides stiffness for the adhesive layer 093, and a material of the flexible substrate includes polyethylene terephthalate etc.

In this embodiment, the elastic buffer layer 06 overlaps with the chip-on-film 091 and the flexible circuit board 092, so that the elastic buffer layer 06 also protects the chip-on-film 091 and the flexible circuit board 092.

Figure 4:
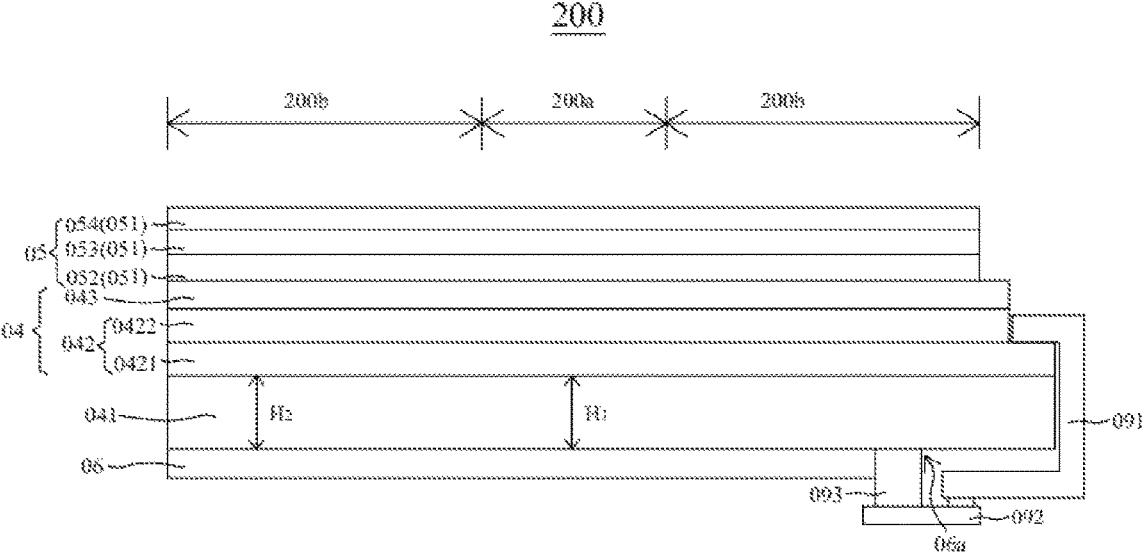
FIG. 4 is a third type of the schematic cross-sectional diagram of the foldable display module according to the embodiment of the present application.

Please refer to FIG. 4, which is a third type of the schematic cross-sectional diagram of the foldable display module according to the embodiment of the present application. The foldable display module shown in FIG. 4 is basically similar to the foldable display module shown in FIG. 3 and thus similarities therebetween are not repeated.

Differences between the structures in FIGS. 3 and 4 include, one end of the chip-on-film 091 is bound to the non-display region of the display main body structure 04, so that the one end of the chip-on-film 091 is connected to the display body structure 04; the chip-on-film 091 is bent so that another end of the chip-on-film 091 is disposed on a side of the glass substrate 041 away from the display main body structure 04; one end of the flexible circuit board 092 is connected to the another end of the chip-on-film 091; the elastic buffer layer 06 is further provided with an opening 06a disposed in the non-foldable region 200b, and going through the elastic buffer layer 06 and exposing the glass substrate 041; the adhesive layer 093 is disposed in the opening 06a and adheres another end of the flexible circuit board 092 to the glass substrate 041, so that the another end of the flexible circuit board 092 is fixed on the glass substrate 041.

Since the adhesive layer 093 is disposed in the opening 06a of the elastic buffer layer 06 and adheres the another end of the flexible circuit board 092 to the glass substrate 041, a thickness of the adhesive layer 093 is thicker to ensure an adhesion force of the adhesive layer 093, and to ensure that the another end of the flexible circuit board 092 is better fixed.

In this embodiment, the opening 06a overlaps with the chip-on-film 091 and the flexible circuit board 092 to reduce a bending diameter of the chip-on-film 091 and improve damage caused by excessive bending of the lines on the chip-on-film 091.

Figure 5:
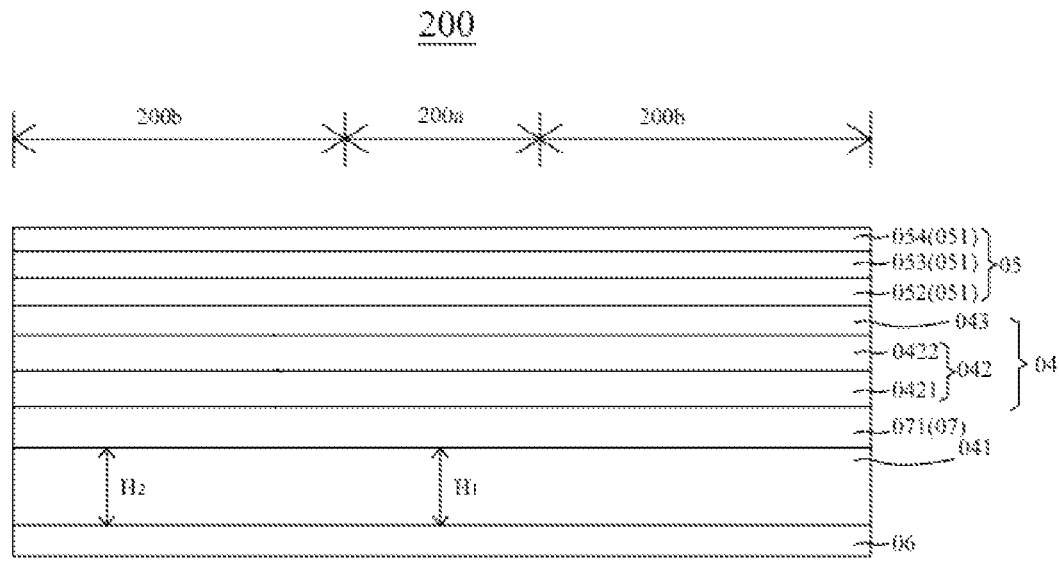
FIG. 5 is a fourth type of the schematic cross-sectional diagram of the foldable display module according to the embodiment of the present application.

Please refer to FIG. 5, which is a fourth type of the schematic cross-sectional diagram of the foldable display module according to the embodiment of the present application. A foldable display module 200 shown in FIG. 5 is basically similar to the foldable display module 200 shown in FIG. 3, and thus similarities therebetween are not repeated. Differences between structures in FIGS. 3 and 5 include that the foldable display module 200 shown in FIG. 5 further includes a flexible substrate 07 disposed between the glass substrate 041 and the display main body structure 04 and being in contact with the glass substrate 041 and the display main body structure 04.

Since the flexible substrate 07 is disposed between the glass substrate 041 and the display main body structure 04, the flexible substrate 07 plays a flattening role for a surface of the glass substrate 041, which improves influence of impurities on the glass substrate 041 or defects of the glass substrate 041 on the display pixel layer 042 of the display main body structure 04.

Specifically, the flexible substrate 07 includes a first flexible substrate 071 disposed between the glass substrate 041 and the display pixel layer 042 of the display main body structure 04, and the first flexible substrate 071 is in direct contact with the surface of the glass substrate 041 and the display pixel layer 042.

The first flexible substrate 071 is yellow. A material of the first flexible substrate 071 includes but is not limited to polyimide. A thickness of the first flexible substrate 071 is greater than or equal to 8 microns and less than or equal to 10 microns.

For example, the thickness of the first flexible substrate 071 is 8.5 microns, 9 microns, 9.4 microns, 9.8 microns or 10 microns.

It should be noted that, the first flexible substrate 071 is formed on the initial glass substrate having the thickness ranging from 480 microns to 520 microns and mentioned above by processes such as coating etc., so that there is a good adhesion force between the first flexible substrate 071 and the glass substrate 041 after the initial glass substrate has been thinned. Further, after other structures such as the display main body structure 04 etc. have been formed on the first flexible substrate 071, the initial glass substrate is then thinned to obtain the foldable display module 200.

Figure 6:
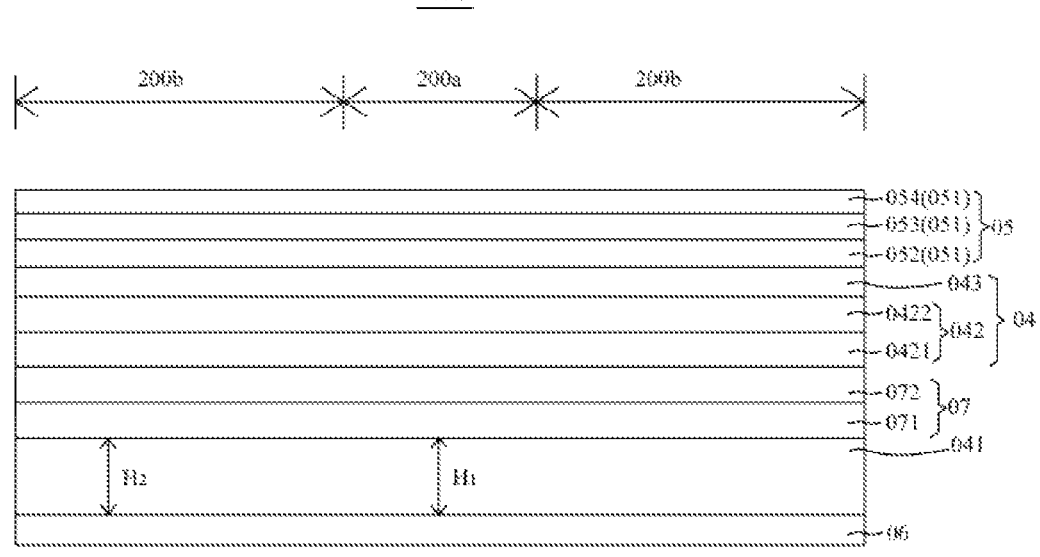
FIG. 6 is a fifth type of the schematic cross-sectional diagram of the foldable display module according to the embodiment of the present application.

Please refer to FIG. 6, which is a fifth type of the schematic cross-sectional diagram of the foldable display module according to the embodiment of the present application. The foldable display module 200 shown in FIG. 6 is basically similar to the foldable display module 200 shown in FIG. 5 and thus similarities therebetween are not repeated. Differences between structures in FIGS. 5 and 6 include that, the flexible substrate 07 of the foldable display module 200 shown in FIG. 6 further includes a second flexible substrate 072 disposed between the display pixel layer 042 and the first flexible substrate 071, and the second flexible substrate 072 is in direct contact with both the first flexible substrate 071 and the display pixel layer 042. Herein, a material of the first flexible substrate 071 is the same as a material of the second flexible substrate 072, and the thickness of the first flexible substrate 071 is greater than a thickness of a second flexible substrate 072.

It should be noted that the second flexible substrate 072 also serves to isolate the first flexible substrate 071 from the display pixel layer 042, thereby improving influence of the first flexible substrate 071 on performance of devices in the display pixel layer 042.

The second flexible substrate 072 is used as a flexible substrate. The second flexible substrate 072 is a transparent polyimide layer.

The thickness of the second flexible substrate 072 is greater than or equal to 4.5 microns and less than or equal to 7.5 microns. For example, the thickness of the second flexible substrate 072 is 4.5 microns, 5.5 microns, 6.5 microns or 7 microns.

Figures 7, 8:
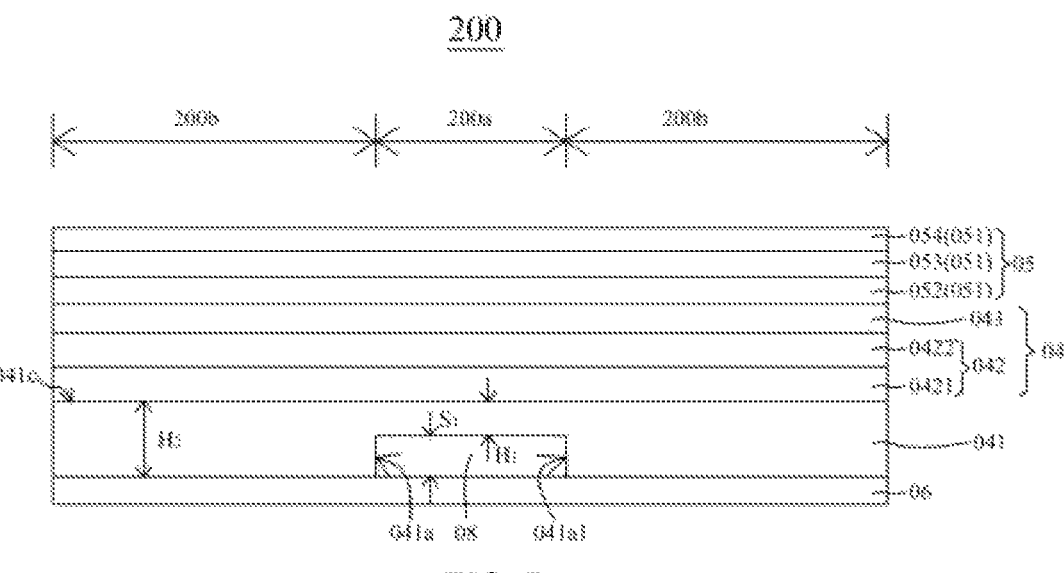
FIG. 7 is a first type of a schematic cross-sectional diagram of a foldable display module according to another embodiment of the present application.
FIG. 8 is a second type of the schematic cross-sectional diagram of the foldable display module according to another embodiment of the present application.

Please refer to FIG. 7, which is a first type of a schematic cross-sectional diagram of a foldable display module according to another embodiment of the present application. The foldable display module 200 shown in FIG. 7 is basically similar to the foldable display module 200 shown in FIG. 2.

and thus similarities therebetween are not repeated. Differences therebetween structures in FIGS. 7 and 2 include that, the glass substrate 041 of the foldable display module 200 shown in FIG. 7 is provided with a groove 041*a* disposed in the foldable region 200*a* and defined in a surface of the glass substrate 041 away from the display main body structure 04.

Since the glass substrate 041 is provided with the groove 041*a* disposed in the foldable region 200*a*, and since the groove 041*a* is defined in the surface of the glass substrate 041 away from the display pixel layer 042, a thickness of the portion of the glass substrate 041 corresponding to the foldable region 200*a* is further thinned, thereby ensuring that the portion of the glass substrate 041 corresponding to the foldable region 200*a* is easier to fold.

In this embodiment, under the condition that the groove 041*a* is disposed in the foldable region 200*a*, the thickness H1 of the portion of the glass substrate 041 corresponding to the foldable region 200*a* is greater than 0 microns. In other words, the groove 041*a* goes through a portion of the glass substrate 041 in the foldable region 200*a*, so that the glass substrate 041 remains a portion in the foldable region 200*a*, so as to protect the display pixel layer 042 and provide a rigid support for the display pixel layer 042. The characteristic of glass substrate 041 that can not generate plastic deformation can also be used to improve creases of the foldable display module 200 which are generated due to plastic deformation of film layers.

Specifically, under the condition that the groove 041*a* is disposed in the foldable region 200*a*, the thickness of the portion of the glass substrate 041 corresponding to the foldable region 200*a* is greater than or equal to 10 microns, and the thickness of the part of the glass substrate 041 corresponding to the foldable region 200*a* is less than 100 microns.

In a thickness direction of the glass substrate 041, a shape of a cross section of the groove 041*a* is any one of rectangle, trapezoid or inverted trapezoid. In a direction perpendicular to the thickness of the glass substrate 041, a shape of a cross section of the groove 041*a* is rectangle.

Specifically, the number of the groove 041*a* is one. In the thickness direction of the glass substrate 041, the shape of the cross-sectional of the groove 041*a* is rectangle. In the direction perpendicular to the thickness of the glass substrate 041, the shape of the cross section of the groove 041*a* is rectangle.

A sum of a depth S1 of the groove 041*a* and the thickness H1 of the portion of the glass substrate 041 corresponding to the foldable region 200*a* is equal to a thickness H2 of the portion of the glass substrate 041 corresponding to the non-foldable region 200*b*. The depth S1 of the groove 041*a* is greater than the thickness H1 of the portion of the glass substrate 041 corresponding to the foldable region 200*a*.

In this embodiment, the thickness H2 of the portion of the glass substrate 041 corresponding to the non-foldable region 200*b* is greater than or equal to 10 microns and less than or equal to 600 microns, so as to ensure that the portion of the glass substrate 041 corresponding to the non-foldable region 200*b* has good rigidity.

Specifically, the thickness H2 of the portion of the glass substrate 041 corresponding to the non-foldable region 200*b* is greater than or equal to 300 microns and less than or equal to 600 microns. For example, the thickness H2 of the portion of the glass substrate 041 corresponding to the non-foldable region 200*b* is 300 microns, 320 microns, 340 microns, 360 microns, 400 microns, 420 microns, 440 microns, 460 microns, 480 microns, 500 microns, 520 microns or 600 microns.

It should be noted that, in this embodiment, an initial glass substrate with a thickness ranging from 480 microns to 520 microns is used as a substrate. After a display pixel layer 042, a thin film encapsulation layer 043 and a function module 05 etc. are sequentially provided on the initial glass substrate, a surface of the initial glass substrate away from the display main body structure 04 is partially thinned to form the groove 041 and to obtain the glass substrate 041.

In this embodiment, the groove 041*a* is formed by a process of partially thinning, a roughness of an inner wall 041*al* defining the groove 041*a* is greater than a roughness of a surface 041*c* of the glass substrate 041 adjacent to the display main body structure 04, and the roughness of the inner wall 041*al* of the groove 041*a* is also greater than a roughness of a surface of the glass substrate 041 disposed in the non-foldable region and away from the display main body structure 04.

In this embodiment, the foldable display module 200 further includes an elastic filling layer 08. The elastic filling layer 08 is filled in the groove 041*a*. A filling thickness of the elastic filling layer 08 in the groove 041*a* is equal to the depth S1 of the groove 041*a*, so as to improve flatness of a back surface of the display main body structure 04, and make it harder for the elastic filling layer 08 to undergo plastic deformation, thereby improving creases of the foldable display module 200 which are generated due to the plastic deformation of the film layers.

A material of the elastic filling layer 08 includes at least one of an adhesive material and an elastic resin, so as to ensure that the elastic filling layer 08 has good elasticity. Herein, a material of the adhesive material includes but is not limited to any one of a liquid optical clear resin (Optical Clear Resin, OCR) and a solid optical clear resin. The liquid optical resin includes, but is not limited to, epoxy resins, acrylic resins, and polyurethanes. The solid optical resin includes, but is not limited to, polysiloxane, epoxy, polyurethane, etc. The elastic resin includes, but is not limited to, silicone and thermoplastic polyurethane.

In this embodiment, when the material of the elastic filling layer 08 includes the adhesive material, the elastic filling layer 08 has elasticity and the elastic filling layer 08 has adhesion performance. Adhesive performance ensures a better adhesion force between the elastic filling layer 08 and the glass substrate 041. During the folding process, peeling between the elastic filling layer 08 and the glass substrate 041 is not easy to occur, thereby prolonging service life of the foldable display module 200. In addition, the elastic filling layer 08 has adhesion performance, which can also reduce a risk of breakage of the portion of the glass substrate 041 corresponding to the foldable region 200a, and can also plays a role of bonding when cracks occur in the portion of the glass substrate 041 corresponding to the foldable region 200a, thereby improving a problem of further crack propagation.

In other embodiments, the material of the elastic filling layer 08 may also include the elastic resin.

In this embodiment, an elastic buffer layer 06 is disposed on a side of the glass substrate 041 away from the display pixel layer 042, and is in direct contact with a surface of the glass substrate 041 away from the display pixel layer 042 and the elastic filling layer 08.

In this embodiment, the material of the elastic buffer layer 06 is the same as the material of the elastic filling layer 08, and the elastic buffer layer 06 and the elastic filling layer 08 are integrated as a whole. Thus, the elastic buffer layer 06 and the elastic filling layer 08 can be formed by one process, thereby simplifying a process of preparing the foldable display module 200, and reducing a risk of peeling between the elastic buffer layer 06 and the elastic filling layer 08. Specifically, the material of the elastic buffer layer 06 and the material of the elastic filling layer 08 are both the elastic resin.

In other embodiments, the material of the elastic buffer layer 06 and the material of the elastic filling layer 08 may also be different. For example, the material of the elastic filling layer 08 includes the adhesive material, and the material of the elastic buffer layer 06 includes the elastic resin, so that the elastic filling layer 08 not only plays a filling role, but also reduces a risk of breakage of the portion of the glass substrate 041 corresponding to the foldable region 200a. The buffer effect of the elastic buffer layer 06 plays a good role in protecting the glass substrate 041.

It can be understood that, in other embodiments, when the material of the elastic buffer layer 06 is different from the material of the elastic filling layer 08, the material of the elastic buffer layer 06 may also include the adhesive material, and the material of the elastic filling layer 08 includes the elastic resin.

In this embodiment, the glass substrate 041 is in direct contact with the display pixel layer 042, and there is no flexible substrate between the glass substrate 041 and the display pixel layer 042, which is beneficial to improve creases of the foldable display module 200 caused by plastic deformation of the flexible substrate.

In this embodiment, the foldable display module 200 shown in FIG. 7 may further include a first flexible substrate 071. The first flexible substrate 071 is disposed between the glass substrate 041 and the display pixel layer 042, and the first flexible substrate 071 is in direct contact with the glass substrate 041 and the display pixel layer 042. For details related to the first flexible substrate 071, please refer to FIG. 5 and related descriptions thereof, which is not repeated here. Alternatively, the foldable display module 200 shown in FIG. 7 may also include a first flexible substrate 071 and a second flexible substrate 072. The first flexible substrate 071 is disposed between the glass substrate 041 and the display pixel layer 042, and the first flexible substrate 071 is in direct contact with a surface of the glass substrate 041. The second flexible substrate 072 is disposed between the display pixel layer 042 and the first flexible substrate 071, and the second flexible substrate 072 is in direct contact with both the first flexible substrate 071 and the display pixel layer 042. For details related to the first flexible substrate 071 and the second flexible substrate 072, please refer to FIG. 6 and related descriptions thereof, which is not repeated here.

Please refer to FIG. 8, which is a second type of the schematic cross-sectional diagram of the foldable display module according to another embodiment of the present application. The foldable display module 200 shown in FIG. 8 is basically similar to the foldable display module 200 shown in FIG. 7, and thus similarities therebetween are not repeated, and differences therebetween include that a groove 041a of the foldable display module 200 shown in FIG. 8 goes through the glass substrate 041 along a thickness direction of the glass substrate 041. In other words, a portion of the glass substrate 041 corresponding to the foldable region 200a is completely removed.

Since the portion of the glass substrate 041 corresponding to the foldable region 200a is completely removed, it can be ensured that the portion of the glass substrate 041 corresponding to the foldable region 200a has good foldability.

In this embodiment, the foldable display module 200 further includes a first flexible substrate 071. The first flexible substrate 071 is disposed between the glass substrate 041 and the display pixel layer 042, and the first flexible substrate 071 is in direct contact with the glass substrate 041 and the display pixel layer 042. Thus, when the portion of the glass substrate 041 corresponding to the foldable region 200a is removed, the first flexible substrate 071 protects the display pixel layer 042, thereby improving impact of process of partial thinning on the initial glass substrate mentioned above.

In this embodiment, the foldable display module 200 shown in FIG. 8 may further include the second flexible substrate 072 shown in FIG. 6. The second flexible substrate 072 is disposed between the first flexible substrate 071 and the display pixel layer 042, and the second flexible substrate 072 is in contact with the first flexible substrate 071 and the display pixel layer 042, so as to further protect the display pixel layer 042.

It should be noted that, for the foldable display module shown in FIG. 2, FIG. 5, FIG. 6, FIG. 7 and FIG. 8, they may also include the chip-on-film 091, the flexible circuit board 092 and the adhesive layer 093 in FIG. 5 and FIG. 6. For details related to this design, please refer to FIG. 5 and FIG. 6 and corresponding descriptions thereof, which is not repeated here.

It should also be noted that compatible technical features in above embodiments can be combined with each other arbitrarily.

Figure 9:
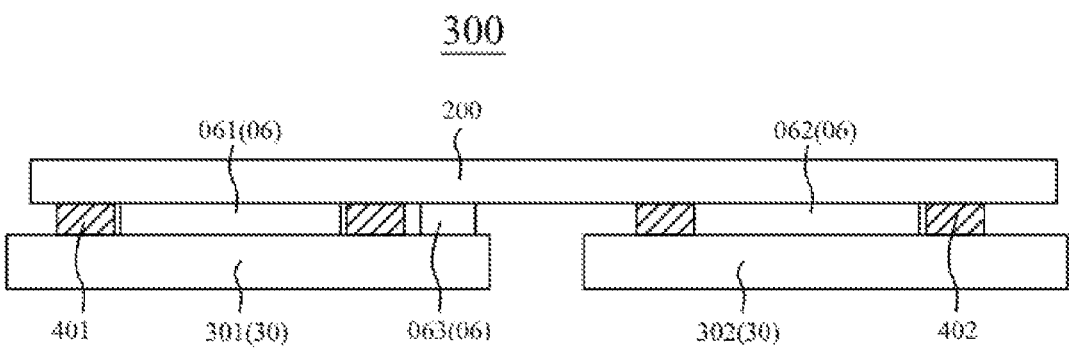
FIG. 9 is a schematic cross-sectional view of a foldable display device according to an embodiment of the present application.

Please refer to FIG. 9, which is a schematic cross-sectional view of a foldable display device according to an embodiment of the present application. A foldable display device 300 includes any one of the foldable display modules 200 mentioned above, a folding mechanism 30, and a frame adhesive. The foldable display module 200 is fixed on the folding mechanism 30 by the frame adhesive.

The folding mechanism 30 includes a first support plate 301 and a second support plate 302. The first support plate 301 and the second support plate 302 are rotationally connected by a hinge mechanism (not shown).

The frame adhesive includes a first frame adhesive 401 and a second frame adhesive 402. The first frame adhesive 401 adheres a portion of the foldable display module 200 corresponding to one non-foldable region 200b to the first support plate 301, and the second frame adhesive 402 adheres a portion of the foldable display module 200 corresponding to another non-foldable region 200b to the second support plate 302.

Specifically, the first frame adhesive 401 adheres the glass substrate 041 in one non-foldable region 200b to the first support plate 301, and the first frame adhesive 401 is contact with the glass substrate 041. The second frame adhesive 402 adheres the glass substrate 041 in another non-foldable region 200b to the second support plate 302.

and the second frame adhesive 402 is in contact with the glass substrate 041.

In this embodiment, the foldable display device 300 further includes an elastic buffer layer 06, the elastic buffer layer 06 overlaps with the non-foldable region 200b, and the elastic buffer layer 06 is disposed between the first support plate 301 and the glass substrate 041 and between the second support plate 302 and the glass substrate 041.

Specifically, the elastic buffer layer 06 includes a first elastic buffer layer 061 and a second elastic buffer layer 062. The first elastic buffer layer 061 is fixed on the first support plate 301. The first elastic buffer layer 061 is disposed between the first support plate 301 and the glass substrate 041 and is in contact with the glass substrate 041. The first frame adhesive 401 is disposed around the first elastic buffer layer 061. The second elastic buffer layer 062 is fixed on the second support plate 302. The second elastic buffer layer 062 is disposed between the second support plate 302 and the glass substrate 041 and is in contact with the glass substrate 041. The second frame adhesive 402 is disposed around the second elastic buffer layer 062. In this embodiment, the elastic buffer layer 06 further includes a third elastic buffer layer 063 disposed outside the first frame adhesive 401 and the second frame adhesive 402. The third elastic buffer layer 063 is disposed between the first support plate 301 and the glass substrate 041, and/or, the third elastic buffer layer 063 is disposed between the second support plate 302 and the glass substrate 041. Specifically, the third elastic buffer layer 063 is disposed between the first support plate 301 and the glass substrate 041.

The elastic buffer layer 06 includes a substrate and an elastic buffer film disposed on the substrate. A surface of the substrate away from the elastic buffer film has adhesion performance. The surface of the substrate having adhesion performance is bonded to the first support plate 301 and the second support plate 302.

It should be noted that at positions where the first frame adhesive 401 and the second frame adhesive 402 are bonded to the glass substrate 041, the elastic buffer layer 06 is removed, and thus there is a better fixing of the foldable display module 200 on the folding mechanism 30.

The descriptions of the above-mentioned embodiments are only used to help understand the technical solutions and core ideas of the present application. Those of ordinary skill in the art should understand that they can still modify the technical solutions described in the foregoing embodiments, or equivalently replace some of the technical features; and these modifications or replacements do not cause the essence of the corresponding technical solutions to deviate from the scope of the technical solutions of the embodiments of the present application.

What is claimed is:

1. A foldable display module, comprising a foldable region and a non-foldable region adjacent to the foldable region, and further comprising:

a display main body structure; and a glass substrate disposed on a back side of a light emitting surface of the display main body structure, wherein a thickness of a portion of the glass substrate corresponding to the foldable region is less than or equal to 100 microns;

the foldable display module further comprises:

an elastic buffer layer disposed on a side of the glass substrate away from the display main body structure, and being in contact with a surface of the glass substrate away from the display main body structure;

wherein the elastic buffer layer is provided with an opening disposed in the non-foldable region, and going through the elastic buffer layer and exposing the glass substrate; and wherein the foldable display module further comprises:

a chip-on-film having one end connected to the display main body structure, and another end disposed on a side of the glass substrate away from the display main body structure with a bending of the chip-on-film;

a flexible circuit board having one end connected to the another end of the chip-on-film; and an adhesive layer disposed in the opening and bonding another end of the flexible circuit board and the glass substrate.

2. The foldable display module of claim 1, wherein the glass substrate is provided with a groove disposed in the foldable region and disposed at the surface of the glass substrate away from the display main body structure.

3. The foldable display module of claim 2, wherein a roughness of an inner wall defining the groove is greater than a roughness of a surface of the glass substrate adjacent to the display main body structure; and a thickness of a portion of the glass substrate corresponding to the non-foldable region is greater than or equal to 300 micros and less than or equal to 600 microns; and wherein the foldable display module further comprises an elastic filling layer filled in the groove.

4. The foldable display module of claim 3, wherein a material of the elastic filling layer is the same as a material of the elastic buffer layer.

5. The foldable display module of claim 4, wherein the material of the elastic buffer layer comprises an elastic resin, and the material of the elastic filling layer comprises at least one of an adhesive material and an elastic resin.

6. The foldable display module of claim 1, wherein there is no adhesive layer disposed between the glass substrate and the display main body structure.

7. The foldable display module of claim 1, wherein the thickness of the portion of the glass substrate corresponding to the foldable region is equal to a thickness of a portion of the glass substrate corresponding to the non-foldable region.

8. The foldable display module of claim 1, wherein in a thickness direction of the glass substrate, a roughness of a surface of the glass substrate away from the display main body structure is greater than a roughness of a surface of the glass substrate adjacent to the display main body structure.

9. The foldable display module of claim 1, wherein the thickness of the portion of the glass substrate corresponding to the foldable region is greater than or equal to 10 microns.

10. The foldable display module of claim 1, further comprising:
a flexible substrate disposed between the glass substrate and the display main body structure and being in contact with the glass substrate and the display main body structure.

11. The foldable display module of claim 1, wherein the glass substrate is in contact with the display main body structure.

12. The foldable display module of claim 1, wherein the display main body structure comprises:
a display pixel layer disposed on a side of the glass substrate; and
a thin film encapsulation layer disposed on a side of the display pixel layer away from the glass substrate and covering the display pixel layer.

13. The foldable display module of claim 1, further comprising:
a function module disposed on a surface of the display main body structure away from the glass substrate and comprising at least two function layers which are stacked, wherein any adjacent two ones of the at least two function layers are in contact with each other.

14. The foldable display module of claim 13, wherein the at least two function layers comprises:
a touch layer disposed on the surface of the display main body structure away from the glass substrate;
a color filter layer disposed on a surface of the touch layer away from the display main body structure; and
a hard coating layer disposed on a surface of the color filter layer away from the touch layer.

15. A foldable display device, comprising:
a foldable display module, comprising a foldable region and a non-foldable region adjacent to the foldable region, and further comprising:
a display main body structure; and
a glass substrate disposed on a back side of a light emitting surface of the display main body structure, wherein a thickness of a portion of the glass substrate corresponding to the foldable region is less than or equal to 100 microns;
the foldable display module further comprises:
an elastic buffer layer disposed on a side of the glass substrate away from the display main body structure, and being in contact with a surface of the glass substrate away from the display main body structure;
wherein the elastic buffer layer is provided with an opening disposed in the non-foldable region, and going through the elastic buffer layer and exposing the glass substrate; and
wherein the foldable display module further comprises:
a chip-on-film having one end connected to the display main body structure, and another end disposed on a side of the glass substrate away from the display main body structure with a bending of the chip-on-film;
a flexible circuit board having one end connected to the another end of the chip-on-film; and
an adhesive layer disposed in the opening and bonding another end of the flexible circuit board and the glass substrate.

16. The foldable display device of claim 15, wherein two non-foldable regions are adjacently connected to opposite sides of the foldable region; and
wherein the foldable display device further comprises:
a first support plate;
a second support plate;
a first frame adhesive adhering the glass substrate in one of the two non-foldable regions to the first support plate; and
a second frame adhesive adhering the glass substrate in another one of the two non-foldable regions to the second support plate.

17. The foldable display device of claim 16, further comprising:
another elastic buffer layer overlapping with the non-foldable area and disposed between the first support plate and the glass substrate and between the second support plate and the glass substrate.

18. The foldable display device of claim 15, wherein the glass substrate is provided with a groove disposed in the foldable region and disposed at the surface of the glass substrate away from the display main body structure.

19. The foldable display device of claim 18, wherein a roughness of an inner wall defining the groove is greater than a roughness of a surface of the glass substrate adjacent to the display main body structure; and
a thickness of a portion of the glass substrate corresponding to the non-foldable region is greater than or equal to 300 micros and less than or equal to 600 microns; and
wherein the foldable display module further comprises an elastic filling layer filled in the groove.

20. The foldable display device of claim 19, wherein a material of the elastic filling layer is the same as a material of the elastic buffer layer.

* * * * *